United States Patent
Chumakov

(10) Patent No.: US 8,508,053 B2
(45) Date of Patent: Aug. 13, 2013

(54) CHIP PACKAGE INCLUDING MULTIPLE SECTIONS FOR REDUCING CHIP PACKAGE INTERACTION

(75) Inventor: Dmytro Chumakov, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 330 days.

(21) Appl. No.: 12/964,359

(22) Filed: Dec. 9, 2010

(65) Prior Publication Data

US 2011/0291298 A1    Dec. 1, 2011

(30) Foreign Application Priority Data

May 31, 2010   (DE) .......................... 10 2010 029 521

(51) Int. Cl.
*H01L 29/40*  (2006.01)
(52) U.S. Cl.
USPC .......................................... 257/778; 438/108
(58) Field of Classification Search
USPC .................. 257/778, E21.449; 438/106–108
See application file for complete search history.

(56) References Cited

U.S. PATENT DOCUMENTS

| | | | |
|---|---|---|---|
| 6,506,681 B2 * | 1/2003 | Grigg et al. | 438/692 |
| 6,603,209 B1 | 8/2003 | DiStefano et al. | 257/781 |
| 7,274,107 B2 * | 9/2007 | Hedler et al. | 257/783 |

FOREIGN PATENT DOCUMENTS

| | | |
|---|---|---|
| DE | 198 00 928 A1 | 4/1999 |
| DE | 103 61 106 A1 | 5/2005 |

OTHER PUBLICATIONS

Translation of Official Communication from German Patent Office for German Patent Application No. 10 2010 029 521.3-33 dated Apr. 4, 2011.

* cited by examiner

*Primary Examiner* — Julio J Maldonado
*Assistant Examiner* — Robert Bachner
(74) *Attorney, Agent, or Firm* — Williams, Morgan & Amerson, P.C.

(57) ABSTRACT

Thermally induced stress in a semiconductor die, i.e., in a complex metallization system thereof, may be reduced by "dividing" a package substrate into two or more substrate sections, which may have formed therebetween an appropriate stress buffer region, for instance a region of superior resiliency. In this case, the total deformation of the package substrate may be reduced, thereby also reducing the thermally induced stress forces in the complex metallization system of the semiconductor die. Hence, for a given size and complexity of a metallization system, an increased production yield and superior reliability may be achieved.

20 Claims, 5 Drawing Sheets

CHIP PACKAGE INCLUDING MULTIPLE SECTIONS FOR REDUCING CHIP PACKAGE INTERACTION

BACKGROUND OF THE INVENTION

1. Field of the Invention

Generally, the present disclosure relates to integrated circuits, and, more particularly, to the techniques for reducing chip-package interactions caused by thermal mismatch between the chip and the package substrate.

2. Description of the Related Art

Semiconductor devices are typically formed on substantially disc-shaped substrates made of any appropriate material. The majority of semiconductor devices including highly complex electronic circuits are currently, and in the foreseeable future will be, manufactured on the basis of silicon, thereby rendering silicon substrates and silicon-containing substrates, such as silicon-on-insulator (SOI) substrates, viable base materials for forming semiconductor devices, such as microprocessors, SRAMs, ASICs (application specific ICs), systems on chip (SoC) and the like. The individual integrated circuits are arranged in an array on the wafer, wherein most of the manufacturing steps, which may involve several hundred and more individual process steps in sophisticated integrated circuits, are performed simultaneously for all chip areas on the substrate, except for photolithography processes, metrology processes and packaging of the individual devices after dicing the semiconductor substrate. Thus, economic constraints drive semiconductor manufacturers to steadily increase the substrate dimensions, thereby also increasing the area available for producing actual semiconductor devices and thus increasing production yield.

In addition to increasing the substrate area, it is also important to optimize the utilization of the substrate area for a given substrate size so as to actually use as much substrate area as possible for semiconductor devices and/or test structures that may be used for process control. In an attempt to maximize the useful surface area for a given substrate size, the feature sizes of circuit elements are steadily scaled down. Due to this ongoing demand for shrinking the feature sizes of highly sophisticated semiconductor devices, copper, in combination with low-k dielectric materials, has become a frequently used alternative in the formation of so-called interconnect structures comprising metal line layers and intermediate via layers that include metal lines as intra-layer connections and vias as inter-layer connections, which commonly connect individual circuit elements to provide the required functionality of the integrated circuit. Typically, a plurality of metal line layers and via layers stacked on top of each other is necessary to realize the connections between all internal circuit elements and I/O (input/output), power and ground pads of the circuit design under consideration.

For extremely scaled integrated circuits, the signal propagation delay is no longer limited by the circuit elements, such as field effect transistors and the like, but is limited, owing to the increased density of circuit elements requiring an even more increased number of electrical connections, by the close proximity of the metal lines, since the line-to-line capacitance is increased and the conductivity of the lines is reduced due to a reduced cross-sectional area. For this reason, traditional dielectrics, such as silicon dioxide (k>3.6) and silicon nitride (k>5), are replaced by dielectric materials having a lower permittivity, which are therefore also referred to as low-k dielectrics having a relative permittivity of 3 or less. However, the density and mechanical stability or strength of the low-k materials may be significantly less compared to the well-approved dielectrics silicon dioxide and silicon nitride. As a consequence, during the formation of the metallization system and any subsequent manufacturing processes of integrated circuits, production yield may depend on the mechanical characteristics of sensitive dielectric materials, such as low-k dielectric layers, and their adhesion to other materials.

In addition to the problems of reduced mechanical stabilities of advanced dielectric materials having a dielectric constant of 3.0 and significantly less, device reliability may also be affected by these materials during operation of sophisticated semiconductor devices due to an interaction between a chip and the package, wherein this interaction is caused by a thermal mismatch of the corresponding thermal expansion of the different materials. For instance, in the fabrication of complex integrated circuits, increasingly a contact technology may be used for connecting the package substrate to the chip, which is known as flip chip packaging technique. Contrary to the well-established wire bonding techniques in which appropriate contact pads may be positioned at the periphery of the very last metal layer of the chip, which may be connected to corresponding terminals of the package by a wire, in the flip chip technology, a respective bump or pillar structure may be formed on the last metallization layer, for instance comprised of a solder material, which may be brought into contact with respective contact pads of the package. Thus, after reflowing the bump material, a reliable electrical and mechanical connection may be established between the last metallization layer and the contact pads of the package substrate. In this manner, a very large number of electrical connections may be provided across the entire chip area of the last metallization layer with reduced contact resistance and parasitic capacitance, thereby providing the 10 (input/output) capabilities as required for complex integrated circuits, such as CPUs, storage memories and the like. During the corresponding process sequence for connecting the bump structure with a package substrate, a certain degree of pressure and/or heat may be applied to the composite device to establish a reliable connection between each of the bumps formed on the chip and the bumps or pads that may be provided on the package substrate. The thermally or mechanically induced stress may, however, also act on the lower lying metallization layers, which may typically include low-k dielectrics or even ultra low-k (ULK) dielectric materials, thereby significantly increasing the probability of creating defects by delamination of these sensitive materials due to reduced mechanical stability and adhesion to other materials.

Moreover, during operation of the composite semiconductor device, i.e., the semiconductor chip attached to the corresponding package substrate, significant mechanical stress may also occur due to a significant mismatch in the thermal expansion behavior of the silicon-based semiconductor chip and the package substrate, since, in volume production of sophisticated integrated circuits, economic constraints typically require the usage of specified substrate materials for the package, such as organic materials, which may typically exhibit a different thermal conductivity and a different coefficient of thermal expansion compared to the silicon chip. Consequently, a premature failure of the metallization system may occur.

With reference to FIGS. 1a-1b, a typical chip-package interaction will be described in more detail.

FIG. 1a schematically illustrates a cross-sectional view of an integrated circuit 100 comprising a semiconductor die or chip 150 connected to a package substrate 170, which is substantially comprised of an organic material, such as a polymer material and the like. As discussed above, in total, the semiconductor chip 150 has a coefficient of thermal expansion (CET) that is significantly different from the CET of the package substrate 170, that is, typically, the CET of the package substrate 170 may be greater compared to the silicon-based semiconductor die 150. The semiconductor die 150 typically comprises a substrate 151, for instance in the form of a silicon substrate or an SOI substrate, depending on the overall configuration of the circuit layout and performance of the integrated circuit 100. Moreover, a silicon-based semiconductor layer 152 is provided "above" the substrate 151, wherein the semiconductor layer 152 comprises a very large number of circuit elements, such as transistors, capacitors, resistors and the like, as are required for implementing the desired functionality of the integrated circuit 100. As previously discussed, the ongoing shrinkage of critical dimensions of circuit elements has resulted in critical dimensions of transistors on the order of magnitude of 50 nm and significantly less in presently available sophisticated semiconductor devices that are produced by volume production techniques.

The semiconductor chip 150 further comprises a metallization system 153, which in advanced semiconductor devices comprises a plurality of metallization layers, i.e., device levels in which metal lines and vias are embedded in an appropriate dielectric material. As explained above, at least a portion of the corresponding dielectric materials used in the various metallization layers of the metallization system 153 are comprised of materials of reduced mechanical stability in order to provide as low a parasitic capacitance of adjacent metal lines as possible. Moreover, the device 150 comprises a bump structure 155 that is appropriately connected to the metallization system 153, wherein the corresponding bumps or metal pillars may be provided as a part of the last metallization layer of the system 153, for instance in the form of a solder material, metal pillars or a combination thereof. On the other hand, the package substrate 170 comprises appropriately positioned and dimensioned contact pads of a contact structure 175, which may be brought into contact with the corresponding bumps of the structure 155 in order to establish respective mechanical and electrical connections upon applying heat and mechanical pressure. Furthermore, the package substrate 170 may comprise any appropriate conductive lines (not shown) in order to connect the bump structure 155 with appropriate terminals, which thus establish an electrical interface to other peripheral components, such as a printed wiring board and the like.

During operation and also during the process of forming the composite device 100 from the semiconductor die 150 and the package substrate 170, heat is generated in the semiconductor chip 150 or is transferred thereto, which may finally result in a significant interaction between the semiconductor die 150 and the package substrate 170, for instance, after reflowing and hardening of the bumps in the structure 155, which may thus result in significant shear forces due to the mismatch in the CETs of the devices 150 and 170. For example, at the interface between the semiconductor die 150 and the package substrate 170, that is, in particular, the bump structure 155 and the metallization system 153 may experience significant mechanical stress forces caused by the thermal mismatch during assembly and operation of the device 100. Due to the reduced mechanical stability and the reduced adhesion of sophisticated dielectric materials, corresponding defects typically occur, which thus affect the overall reliability and also production yield when operating or manufacturing the integrated circuit 100. For example, a certain degree of thermally induced stress, as indicated by 103, may occur in the package substrate 170, thereby resulting in a certain degree of bending or bowing, indicated by 176, due to any temperature gradients and the increased CET of the material 170 compared to the semiconductor die 150.

FIG. 1b schematically illustrates an enlarged view of a portion of the metallization system 153 during a typical situation when operating the integrated circuit 100 or when assembling the device 100 in a final phase, when the solder bumps increasingly harden after reflowing of any solder material. As illustrated, the metallization system 153 comprises the plurality of metallization layers, wherein, for convenience, two metallization layers 154 and 156 are illustrated. For example, the metallization layer 156 comprises a dielectric material 156A, in which corresponding metal lines 156B and vias 156C are embedded. Similarly, the metallization layer 154 comprises a dielectric material 154A and respective metal lines 154B and vias 154C. As previously explained, at least some of the metallization layers in the metallization system 153 comprise a sensitive dielectric material in the form of a low-k dielectric material or a ULK material, which exhibits a significantly reduced mechanical stability compared to other dielectrics, such as silicon nitride, silicon carbide, nitrogen-containing silicon carbide, which may frequently be used as etch stop or capping layers provided between the individual metallization layers 154, 156. Consequently, during operation or assembly of the integrated circuit 100, because of the different behavior with respect to thermal expansion, a significant mechanical stress is transferred into the metallization layers 156, 154, as indicated by 103. The stress 103 is also present in the package substrate 170 (FIG. 1a), and may result in a material deformation, as indicated by 176 (FIG. 1a). On the other hand, the mechanical stress 103 in the metallization system 153 may induce a more or less pronounced strained state that results in the creation of certain defects 154D, 156D, which in turn may finally result in a certain degree of delamination, since typically the adhesion and mechanical stability of ULK dielectric materials is reduced compared to conventional dielectric materials, as discussed above. Consequently, the resulting delamination may finally result in a premature failure of the metallization system 153 or in an initial failure of the metallization system, thereby contributing to reduced production yield and reduced overall reliability of the integrated circuit 100 (FIG. 1a).

The problem of reduced reliability and reduced production yield of sophisticated metallization systems is even further exacerbated in advanced process technologies in which the dielectric constant of the low-k dielectric materials is to be further reduced, while at the same time the dimensions of the corresponding chip areas are increased in order to incorporate more and more functions into the integrated circuits. On the other hand, the increased complexity of the overall circuit layout may also require an increased number of stacked metallization layers, as previously explained, which may additionally result in a reduced overall mechanical stability of the metallization system. Furthermore, the usage of lead-free materials in the bump structure 155 (FIG. 1a) may result in an increased mechanical coupling of the package substrate 170 and the semiconductor chip 150, thereby resulting in even higher mechanical stress, since typically lead-free contact assemblies are less resilient compared to lead-containing solder materials.

For these reasons, in conventional approaches, the overall size of the semiconductor die has to be restricted to appropriate dimensions in performance driven metallization systems so as to maintain the overall mechanical stress components at an acceptable level. In other cases, the number of metallization layers may be restricted, thereby also reducing the packing density and/or complexity of the circuit layout. In still other conventional approaches, less sophisticated dielectric materials are used in order to enhance the overall mechanical stability, thereby, however, sacrificing performance of the integrated circuits.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally relates to techniques and semiconductor devices in which the chip package interaction may be reduced for a given degree of complexity and size of the semiconductor die. To this end, the package substrate may be divided into two or more substrate sections, which may be mechanically "decoupled" to a certain degree so that, in total, the resulting interaction with the semiconductor die may be reduced. For example, the two or more substrate sections of the package substrate may be connected in a mechanically resilient manner by providing an appropriate stress buffer region formed on the basis of an appropriate material, thereby enabling a reduced degree of deformation of the package substrate when connected to the semiconductor die having the significantly reduced thermal expansion. That is, by providing various substrate sections in the package substrate which have a reduced mechanical coupling to each other, the actual interaction area with the semiconductor die is also "divided" into corresponding sections, thereby reducing the mechanical stress in each of the corresponding areas of the semiconductor die. Consequently, the mechanical stress components induced during operation of the composite semiconductor device or during the assembly of the semiconductor die and the package substrate may be significantly reduced, thereby avoiding or at least reducing the number and degree of any defects in the complex metallization system.

In some illustrative embodiments disclosed herein, the package substrate may be provided in the form of individual substrate sections without any mechanical coupling to each other, and the individual substrate sections may be attached to the semiconductor die in this mechanically decoupled state, thereby also providing significantly reduced mechanical stress in the semiconductor die during the assembly process and also during the operation of the packaged semiconductor device. For this purpose, the individual package substrate sections may be provided as electrically "stand alone" substrate portions, which may not require any additional electrical connection.

One illustrative semiconductor device disclosed herein comprises a semiconductor chip comprising a chip contact structure. The semiconductor device further comprises a package substrate connected to the chip contact structure, wherein the package substrate comprises a first substrate section, a second substrate section and a stress buffer region laterally separating the first and second substrate sections, wherein the stress buffer region resiliently connects the first and the second substrate sections.

One illustrative package for receiving a semiconductor chip disclosed herein comprises a package substrate that comprises a first substrate section and a second substrate section, which are mechanically resiliently connected by a stress buffer region. The package further comprises a package contact structure formed above the package substrate and configured to directly connect to a complementary contact structure of a semiconductor chip.

One illustrative method disclosed herein relates to forming a packaged semiconductor device. The method comprises providing a semiconductor chip that comprises a chip contact structure. Moreover, the method comprises attaching a first substrate section of a package substrate to a first portion of the chip contact structure. The method additionally comprises attaching a second substrate section of the package substrate to a second portion of the chip contact structure so as to form a stress buffer region laterally between the first and second substrate sections.

BRIEF DESCRIPTION OF THE DRAWINGS

The disclosure may be understood by reference to the following description taken in conjunction with the accompanying drawings, in which like reference numerals identify like elements, and in which.

Figure 1A:
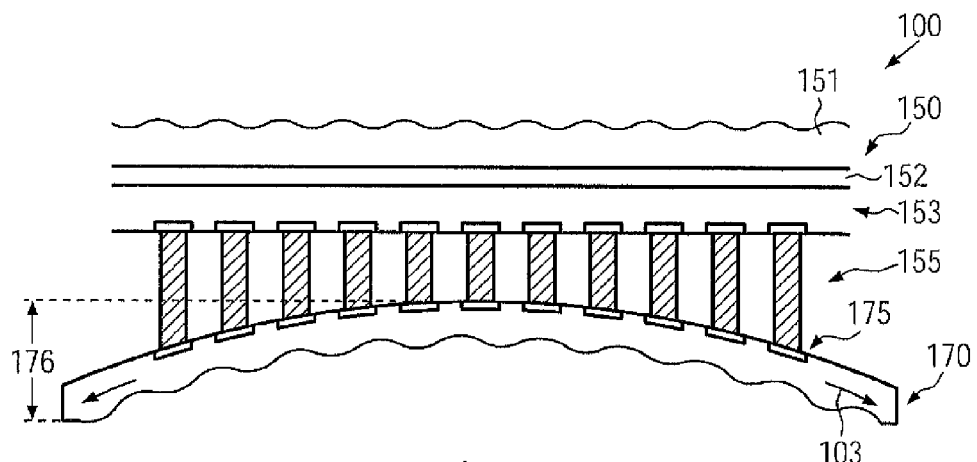
FIG. 1a schematically illustrates a cross-sectional view of an integrated circuit comprising a semiconductor die and a package substrate which are directly coupled by means of a bump structure, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides packaged semiconductor devices, package substrates and methods of assembling a packaged semiconductor device, in which the problem of reduced reliability and increased mechanical defects in metallization systems of advanced semiconductor devices is addressed by reducing the chip package interaction. To this end, the mechanically "active" area of the package substrate may be reduced by providing two or more sections in the package substrate, which are mechanically decoupled to a certain degree so that, for instance, the degree of deformation in the package substrate as a whole is significantly reduced, thereby also reducing the mechanical stress in the semiconductor die. A pronounced degree of decoupling of the individual sections of the package substrate may be accomplished in some illustrative embodiments by providing a stress buffer region which may include an appropriate material that connects to the various package substrate sections in a resilient manner. That is, the stress buffer region may be comprised of a material or may have any appropriate configuration so as to enable a certain degree of deformation of the package substrate sections, for instance upon a thermal expansion or contraction, with reduced mechanical effect on the neighboring substrate sections. For example, the stress buffer region may be provided in the form of any appropriate material, which may be resilient with respect to the material of the substrate sections and which may thus respond to an externally applied mechanical stress, for instance transferred by the package substrate sections, without significantly affecting the substrate sections. On the other hand, the resilient material in the stress buffer region may provide a certain mechanical coupling of the various substrate sections, thereby enabling a corresponding handling of the substrate, for instance upon forming appropriate contact structures and conductor lines according to device requirements. For example, a plurality of dielectric materials are available which may typically have a significantly higher degree of resilience compared to the organic materials of typical package substrates, which may thus be efficiently used within the corresponding stress buffer regions between the individual package substrate sections. For example, silicone-based materials may be used as efficient stress buffer materials.

In other illustrative embodiments disclosed herein, the package substrate may be provided in the form of completely decoupled substrate sections which may be attached to the semiconductor die during the assembly process, thereby providing appropriate expansion space between the individual substrate sections, which may thus act as efficient stress buffer regions. In this case, the individual package substrate sections may be designed such that the required conductor lines for connecting to peripheral components may be provided completely within each section without requiring any conductor lines connecting between the individual substrate sections. Consequently, the individual substrate sections may be fabricated on the basis of well-established process techniques on the basis of a layout that takes into consideration the position and size of the section in view of the total package substrate, wherein, after the assembly of the packaged semiconductor device, any appropriate fill materials may be provided, such as resilient dielectric materials, if an additional mechanical coupling between the substrate sections may be considered appropriate.

In still other illustrative embodiments disclosed herein, the material in the stress buffer region may be provided with an appropriately selected coefficient of thermal expansion, possibly in combination with a material displacement volume, in order to avoid undue mechanical stress and thus an undue mechanical coupling of the individual substrate sections during assembly and/or operation of the composite semiconductor device. For example, by providing a material displacement volume in the stress buffer region, any displacement of a resilient material in the stress buffer region may be compensated for, for instance, upon a thermal expansion of the adjacent substrate sections of the package substrate. Consequently, any undue mechanical stress caused by any resilient material in the stress buffer region may be reduced.

Figure 1B:
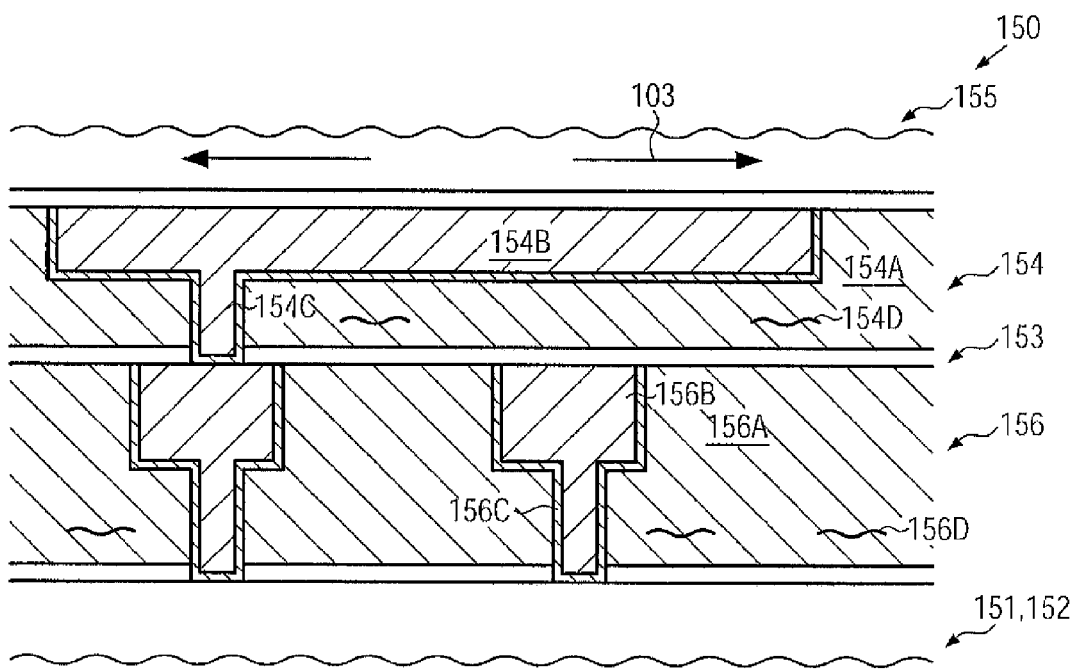
FIG. 1b schematically illustrates a cross-sectional view of a portion of a metallization system of the semiconductor die of FIG. 1a, wherein a plurality of mechanical defects may occur upon assembly and/or operation of the integrated circuit.

With reference to FIGS. 2a-2i, further illustrative embodiments will now be described in more detail, wherein reference may also be made to FIGS. 1a-1b, if appropriate.

Figure 2A:
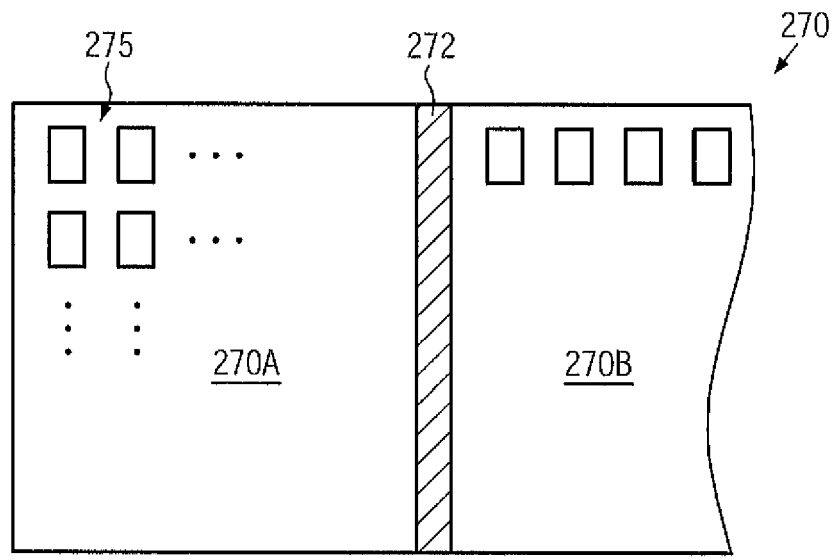
FIGS. 2a-2b schematically illustrate top views of a package substrate including two or more substrate sections that are connected in a resilient manner by a stress buffer region, according to illustrative embodiments.

FIG. 2a schematically illustrates a top view of a package substrate 270, which may comprise a first substrate section 270A and a second substrate section 270B, which may be separated by a stress buffer region 272. As illustrated, the package substrate 270 may comprise an appropriately adapted contact structure 275, which may be appropriately connected to a complementary contact structure of a semiconductor die, as is also previously explained. Furthermore, typically, the package substrate 270 may comprise any conductor lines (not shown) for connecting to peripheral devices, such as printed wiring boards and the like, as is also previously explained. The substrate sections 270A, 270B may be comprised of any appropriate material, such as organic materials as are typically used for forming package substrates of semiconductor die, as is also previously discussed. Contrary to conventional approaches, however, the package substrate 270 may be appropriately divided into "functional zones," i.e., into the sections 270A, 270B, so as to connect to respective portions of a contact structure of a semiconductor die. Consequently, by providing two or more individual package substrate sections, such as the sections 270A, 270B, the corresponding interaction areas with the semiconductor device are also reduced in size, thereby reducing the degree of interaction upon assembling the packaged semiconductor device and/or upon operating a semiconductor device. To this end, the stress buffer region 272 may be provided in the form of a resilient material, which may respond to mechanical stress induced by the sections 270A, 270B by a pronounced deformation, while at the same time significantly reducing the mechanical coupling of the sections 270A, 270B. Consequently, upon thermal stress, each of the sections 270A, 270B may deform in a substantially independent manner, thereby reducing the overall degree of deformation of the package substrate 270 as a whole compared to a conventional non-divided package substrate. It should be appreciated that the lateral size of the stress buffer region 272 may be appropriately adapted to the expected thermal expansion of the sections 270A, 270B during typical assembly and operating conditions. For example, a gap width of the stress buffer region 272 may range from several tenths of micrometers to a hundred micrometers and more, depending on the complexity of the contact structure 275. As indicated above, a plurality of resilient materials are available, for instance based on silicone and the like, wherein, in some illustrative embodiments, the CET of the material in the stress buffer region 272 may differ from the CET of the sections 270A, 270B.

Figure 2B:
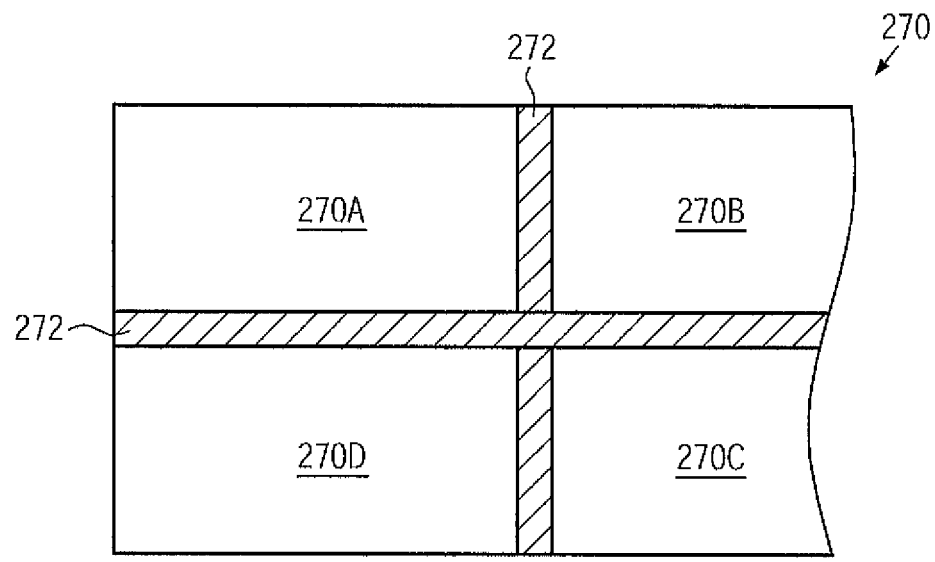

FIG. 2b schematically illustrates the package substrate 270 according to illustrative embodiments in which more than two sections may be provided. For example, the package substrate 270 may be divided into four sections 270A, 270B, 270C, 270D, which may be laterally separated by the stress buffer region 272.

For example, in some illustrative embodiments, the individual sections 270A, 270B, 270C, 270D may be designed in such a manner that conductor lines may not have to be provided so as to connect between individual sections 270A, 270B, 270C, 270D. In other cases, as will be described later on in more detail, appropriate conductor lines may be provided so as to connect between two adjacent substrate sections via the stress buffer region 272.

The package substrate 270 as shown in FIGS. 2a and 2b may be formed on the basis of the following process techniques. The individual sections 270A, 270B, 270C, 270D may be formed on the basis of well-established process strategies, for example by providing individual layers of an appropriate material and forming therein the conductor lines in accordance with the overall device requirements. If required, the layout of the contact structure 275 and of the conductor lines (not shown) may be appropriately designed or redesigned such that any conductive connections between adjacent sections may be avoided. In this case, in some illustrative embodiments, the sections 270A, 270B, 270C, 270D may be formed as individual package substrates and may be subsequently connected by providing an appropriate resilient material between adjacent substrate sections in order to form the stress buffer region 272. In other cases, the sections 270A, 270B, 270C, 270D may be formed as a single entity, for instance for the various substrate layers, if required, and each of the layers may be subsequently diced, except for any conductor lines which may have to be provided across the stress buffer region 272. It should be appreciated, however, that any other manufacturing strategy may be applied, as long as the stress buffer region 272 may be provided with a resilient behavior in order to split the mechanical interaction area of the package substrate 270 into several smaller parts.

Figure 2C:
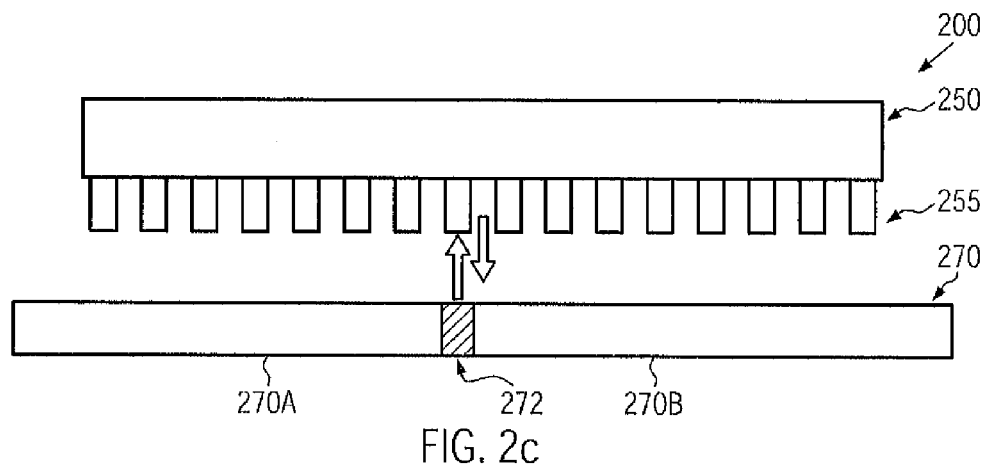
FIG. 2c schematically illustrates a cross-sectional view of a semiconductor die and a package substrate comprising resiliently coupled substrate sections prior to forming a composite device, according to illustrative embodiments.

FIG. 2c schematically illustrates a semiconductor die 250 comprising a bump structure 255, which is to be connected to the package substrate 270, which may comprise, as previously discussed, the first substrate section 270A, the second substrate section 270B and the intermediate stress buffer region 272 of superior resilient behavior.

The semiconductor die 250 may have a configuration as previously explained with reference to the integrated circuit 100 and the semiconductor die 150 shown in FIGS. 1a and 1b. That is, typically, a complex metallization system (not shown), such as the metallization system 153 of the device 100, may be provided in combination with the bump structure 255. The bump structure 255 may have a complementary configuration compared to the contact structure 275 (FIG. 2a) in order to enable a direct electrical and mechanical contact between the die 250 and the package substrate 270, as is also previously discussed.

Upon assembling the die 250 and the package substrate 270, i.e., upon attaching the die 250 on the package substrate 270, these components are brought into mechanical contact and heat may be applied so as to form an electrical and mechanical contact between the bump structure 255 and the complementary contact structure 275 (FIG. 2a), for instance by reflowing a solder material and the like, as is also previously explained.

Figure 2D:
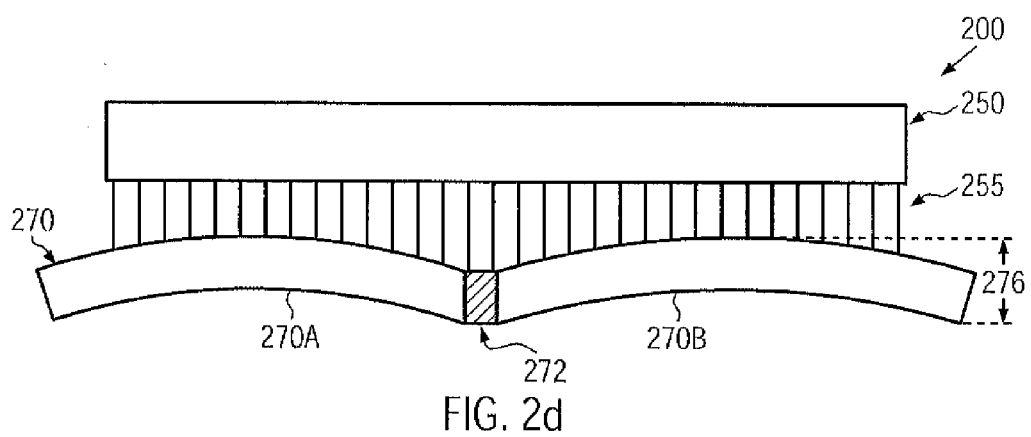
FIG. 2d schematically illustrates an integrated circuit including the semiconductor chip and package substrate with the two or more substrate sections, according to illustrative embodiments.

FIG. 2d schematically illustrates a composite semiconductor device 200 or integrated circuit comprising the semiconductor die 250 and the package substrate 270. During the assembly process or during operation of the device 200, the mismatch in thermal expansion may result in a certain degree of deformation, for instance, in the package substrate 270, as is also previously explained. However, contrary to conventional devices, the resulting deformation, indicated by 276, may be significantly reduced since the substrate sections 270A and 270B may be deformed substantially independently due to the presence of the resilient stress buffer region 272. Consequently, each of the sections 270A, 270B may have a similar degree of deformation, however, with a significantly reduced magnitude compared to the situation as described with reference to the device 100 in FIG. 1a so that the resulting mechanical stress in the semiconductor die 250, transferred via the bump structure 255 into the corresponding metallization system, may be reduced. Consequently, the number and the size of any mechanical defects in the metallization system may be reduced compared to the situation as shown in FIG. 1b for the metallization system 153 of the device 150. Consequently, for a given size and complexity of the semiconductor device 250, which may, for instance, correspond to the configuration of the device 150, enhanced production yield and superior reliability of the composite semiconductor device 200 may be obtained.

Figure 2E:
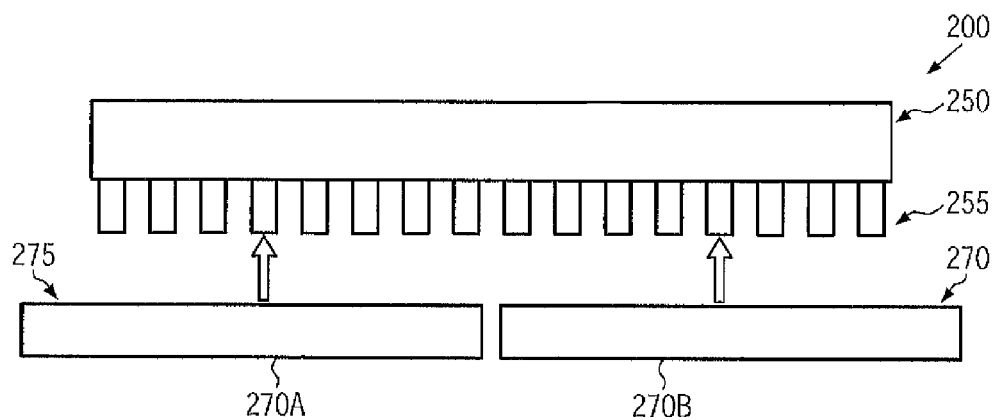
FIGS. 2e-2f schematically illustrate a semiconductor die and a package substrate during assembly of a composite integrated circuit on the basis of individual substrate sections without mechanical coupling, according to still further illustrative embodiments.

FIG. 2e schematically illustrates the semiconductor die 250 and the package substrate 270 according to further illustrative embodiments. As illustrated, the package substrate 270 may be provided in the form of two or more substrate sections, such as the sections 270A, 270B, which may represent "stand alone" substrate sections without a mechanical coupling. To this end, the contact structure 275 and corresponding conductor lines within the sections 270A, 270B may be designed so as to enable the required electrical connection with the bump structure 255 and with a peripheral component, such as a printed wiring board, without requiring any conductor lines between the sections 270A, 270B. In some illustrative embodiments (not shown), any additional conductor lines may be provided in a subsequent manufacturing stage, i.e., after attaching sections 270A, 270B to the bump structure 255, which may be accomplished on the basis of wire bonding and the like. It should be appreciated that, in this case, the number of any required electrical connections may be very low by appropriately designing the substrate 270 and the contact structure 255, while also the length of respective conductor lines may be small, thereby not unduly contributing to parasitic capacitance and line resistance.

Figure 2F:
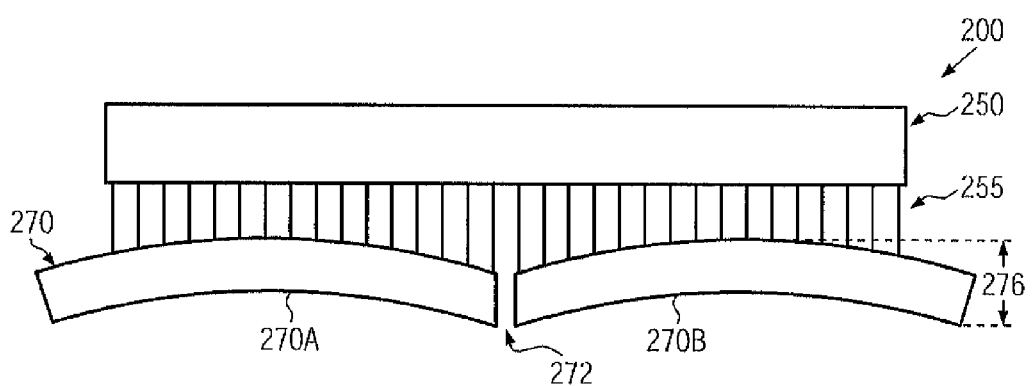

FIG. 2f schematically illustrates the composite semiconductor device 200 upon or after attaching the substrate sections 270A, 270B to the bump structure 255. To this end, the sections 270A, 270B may be appropriately aligned to the corresponding portions of the contact structure 255 and may be connected on the basis of well-established bond techniques, wherein the sections 270A, 270B may be attached concurrently or sequentially, depending on the tool capability of a corresponding process tool, for instance in terms of handling package substrates, aligning the same with the semiconductor die 250 and the like. Thus, upon attaching the sections 270A, 270B, a stress buffer region 272 may be provided, for instance in the form of an expansion gap, which may be subsequently filled, at least partially, with an appropriate resilient material and the like.

Figure 2G:
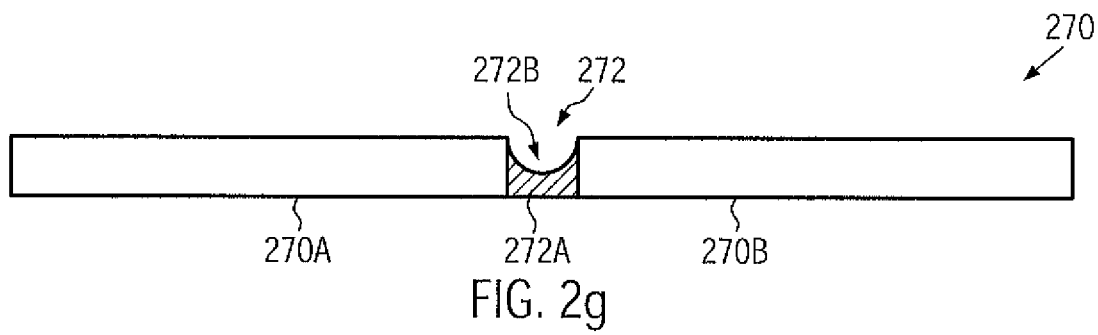
FIGS. 2g-2h schematically illustrate a package substrate comprising a plurality of substrate sections and a stress buffer region including a material displacement volume during various operating states, according to illustrative embodiments.

FIG. 2g schematically illustrates the package substrate 270 according to further illustrative embodiments in which the stress buffer region 272 may comprise a resilient material 272A in order to provide a certain degree of mechanical coupling between the sections 270A, 270B, which may be advantageous in terms of handling the substrate 270 and the like. Moreover, the stress buffer region 272 may comprise a space or volume 272B, which may also be referred to as a material displacement volume, in order to provide space for accommodating material upon thermal expansion of the sections 270A, 270B and the material 272A. The material displacement volume 272B may be provided, for instance, by substantially completely filling the region 272 with the material 272A and subsequently removing a portion thereof, for instance, by mechanical interaction, etching and the like.

Figure 2H:
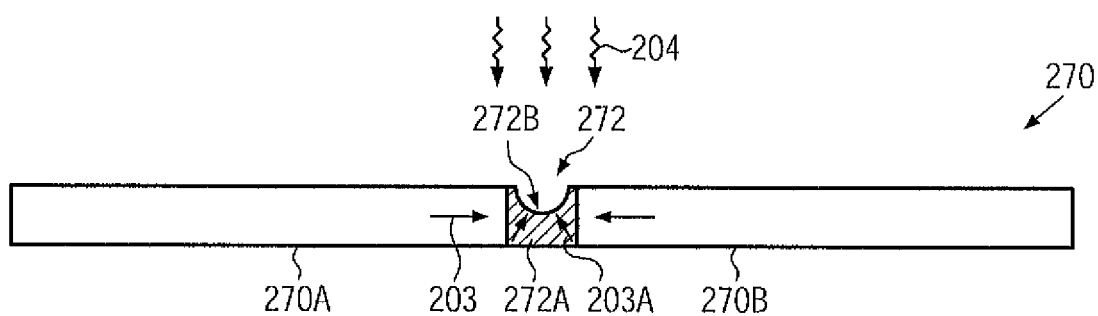

FIG. 2h schematically illustrates the package substrate 270 when subjected to elevated temperatures, as indicated by 204, which may occur when the package substrate 270 is attached to a semiconductor die, as previously discussed, when assembling a packaged semiconductor device or when operating the same. As indicated, due to the elevated temperatures 204, a thermal expansion of the sections 270A, 270B may occur and may result in a certain thermally induced stress 203, which in turn may act on the stress buffer region 272. Due to the resilient nature of the material 272A, any increase of volume, for instance by the material expansion of the material 27Aa itself, indicated by 203A, and an additional material displacement caused by the thermal stress 203 may be appropriately accommodated by the volume 272B. Consequently, any negative influence on other components, such as a semiconductor die and the like, may be substantially avoided.

Figure 2I:
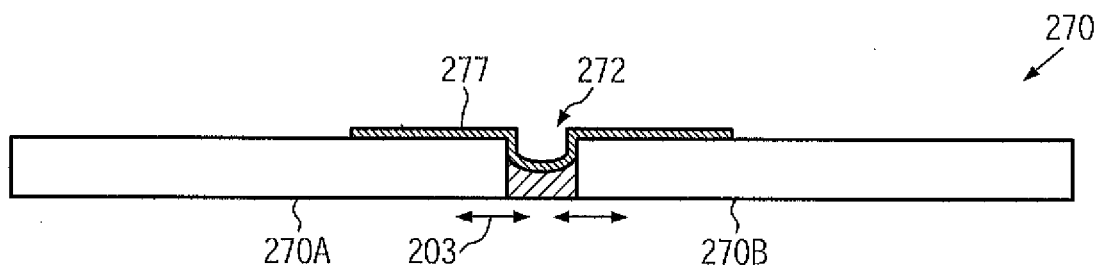
FIG. 2i schematically illustrates a cross-sectional view of a package substrate comprising a conductor line electrically connecting to substrate sections across a stress buffer region, according to still further illustrative embodiments.

FIG. 2i schematically illustrates the package substrate 270 according to still further illustrative embodiments in which a conductor line 277 may be formed in or above the section 270A and the section 270B so as to establish an electrical connection via the stress buffer region 272. To this end, the conductor line 277 may be provided in the form of any appropriate conductive material, such as a metal line and the like, wherein the non-linear configuration of the metal line 277 may provide sufficient elasticity in order to compensate for any thermally driven material displacement in the sections 270A, 270B and 272. Consequently, the conductor line 277 may also exhibit a "resilient" behavior, thereby providing a reliable electrical connection between the sections 270A, 270B, if required.

As a result, the present disclosure provides packaged semiconductor devices, package substrates and methods of assembling semiconductor die and a package substrate, wherein an area of interaction between the semiconductor die and the package substrate due to a thermal mismatch may be reduced by appropriately dividing the package substrate into two or more substrate sections, which may be mechanically decoupled to a certain degree, for instance by providing a stress buffer region. The stress buffer region may be provided in the form of a resilient material or by an expansion gap, wherein, if required, appropriate electrical connections may be provided across the stress buffer region. In some illustrative embodiments, the substrate sections may be provided as "stand alone" sections, thereby providing an efficient overall manufacturing process for forming the package substrates and also providing superior flexibility in attaching the semiconductor die to the package substrate. Consequently, for a given complexity and size of the semiconductor die, significantly reduced effects in complex metallization systems may be created, while at the same time overall reliability of the packaged semiconductor device may be increased.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention.

Accordingly, the protection sought herein is as set forth in the claims below.

What is claimed:

1. A semiconductor device, comprising:
   a semiconductor chip comprising a chip contact structure; and
   a package substrate connected to said chip contact structure, said package substrate comprising a first substrate section, a second substrate section that is physically separated from said first substrate section and a stress buffer region positioned between and laterally separating said first and second physically separated substrate sections, said stress buffer region resiliently connecting said first and second substrate sections to one another.

2. The semiconductor device of claim 1, wherein said package substrate comprises three or more physically separated substrate sections that are laterally separated by said stress buffer region.

3. The semiconductor device of claim 1, wherein said stress buffer region extends through said package substrate along its entire thickness.

4. The semiconductor device of claim 1, wherein said stress buffer region comprises a fill material having a coefficient of thermal expansion that differs from a coefficient of thermal expansion of said first and second substrate sections.

5. The semiconductor device of claim 1, wherein said stress buffer region comprises a material displacement volume that is configured to accommodate a portion of a resilient material upon thermal expansion.

6. The semiconductor device of claim 1, wherein said chip contact structure comprises lead-free solder material.

7. The semiconductor device of claim 1, wherein said chip contact structure comprises metal pillars.

8. The semiconductor device of claim 1, further comprising a metallization system formed above said semiconductor chip and comprising one or more metallization layers, wherein at least one of said one or more metallization layers comprises a dielectric material having a dielectric constant of approximately 3.0 or less.

9. The semiconductor device of claim 1, further comprising a conductor line extending from said first substrate section across said stress buffer region to said second substrate section.

10. A package for receiving a semiconductor chip, comprising:
    a package substrate comprising a first substrate section and a second substrate section that is physically separated from said first substrate section and a stress buffer region that mechanically and resiliently connects said first and second substrate sections to one another; and
    a package contact structure formed above said package substrate and configured to directly connect to a complementary contact structure of said semiconductor chip.

11. The package of claim 10, wherein said stress buffer region comprises a resilient fill material.

12. The package of claim 10, wherein said stress buffer region comprises a displacement volume configured to compensate for a thermal expansion of said first and second substrate sections.

13. The package of claim 10, wherein said package substrate comprises three or more substrate sections that are laterally separated by said stress buffer region.

14. The package of claim 10, further comprising a conductor line extending from said first substrate section across said stress buffer region to said second substrate section.

15. The package of claim 10, wherein said package contact structure is configured to connect to said complementary contact structure using lead-free contact elements.

16. A method of forming a packaged semiconductor device, the method comprising:
    providing a semiconductor chip comprising a chip contact structure;
    attaching a first substrate section of a package substrate to a first portion of said chip contact structure;
    attaching a second substrate section of said package substrate to a second portion of said chip contact structure; and
    forming a stress buffer region laterally between said first and second substrate sections so as to mechanically and resiliently connect said first and second substrate sections to one another.

17. The method of claim 16, wherein said first and second substrate sections are concurrently attached to said chip contact structure.

18. The method of claim 16, wherein said first substrate section is attached to said first portion of said chip contact structure prior to attaching said second substrate section to said second portion of said chip contact structure.

19. The method of claim 16, further comprising forming said stress buffer region prior to attaching said first and second substrate sections to said first and second portions of said chip contact structure.

20. The method of claim 16, wherein said first and second substrate sections are attached to said chip contact structure by using lead-free contact elements.

* * * * *